United States Patent
Jain et al.

(10) Patent No.: US 10,454,418 B1
(45) Date of Patent: Oct. 22, 2019

(54) VOLTAGE-CONTROLLED OSCILLATOR WITH HIGH AND LOW GAIN OPTIONS

(71) Applicant: Xilinx, Inc., San Jose, CA (US)

(72) Inventors: Ankur Jain, Sunnyvale, CA (US); Jaeseo Lee, San Jose, CA (US); Richard W. Swanson, San Jose, CA (US)

(73) Assignee: XILINX, INC., San Jose, CA (US)

( * ) Notice: Subject to any disclaimer, the term of this patent is extended or adjusted under 35 U.S.C. 154(b) by 318 days.

(21) Appl. No.: 15/432,781

(22) Filed: Feb. 14, 2017

(51) Int. Cl.
| | |
|---|---|
| H03B 1/00 | (2006.01) |
| H03K 3/03 | (2006.01) |
| H03L 7/099 | (2006.01) |
| G05F 1/46 | (2006.01) |
| G05F 1/575 | (2006.01) |

(52) U.S. Cl.
CPC ............. *H03B 1/00* (2013.01); *G05F 1/46* (2013.01); *G05F 1/575* (2013.01); *H03K 3/0315* (2013.01); *H03L 7/0995* (2013.01); *H03B 2200/0082* (2013.01)

(58) Field of Classification Search
CPC .. G05F 1/575; G05F 1/46; H03B 1/00; H03B 2200/0082; H03K 3/0315; H03L 7/0995
USPC .... 331/57, 183, 185, 186, 17; 323/282, 538, 323/234
See application file for complete search history.

(56) References Cited

U.S. PATENT DOCUMENTS

| | | | |
|---|---|---|---|
| 5,999,025 A | 12/1999 | New | |
| 6,157,180 A * | 12/2000 | Kuo | G05F 3/242 |
| | | | 323/282 |
| 6,462,594 B1 | 10/2002 | Robinson et al. | |
| 6,614,318 B1 | 9/2003 | Boecker | |
| 6,624,668 B1 | 9/2003 | Robinson et al. | |
| 6,650,195 B1 | 11/2003 | Brunn et al. | |
| 6,683,502 B1 | 1/2004 | Groen et al. | |
| 6,809,676 B1 | 10/2004 | Younis et al. | |
| 6,995,618 B1 | 2/2006 | Boecker | |
| 7,109,809 B1 | 9/2006 | Groen et al. | |
| 7,184,511 B2 | 2/2007 | Younis et al. | |

(Continued)

OTHER PUBLICATIONS

Alon, Elad et al., "Replica Compensated Linear Regulators for Supply-Regulated Phase-Locked Loops," IEEE Journal of Solid-State Circuits, Feb. 2006, pp. 413-424, vol. 41, No. 2, IEEE, Piscataway, New Jersey, USA.

(Continued)

*Primary Examiner* — Arnold M Kinkead
(74) *Attorney, Agent, or Firm* — Patterson + Sheridan, LLP

(57) ABSTRACT

In an example, a voltage-controlled oscillator (VCO) includes: an oscillator having a supply input; and a voltage regulator, coupled to the supply input. The voltage regulator includes: a first transistor and a second transistor providing a first source-coupled transistor pair, and a third transistor and a fourth transistor providing a second source-coupled transistor pair; an active load coupled to drains of the first, second, third, and fourth transistors; a first current source coupled to sources of the first and second transistors, and a second current source coupled to sources of the third and fourth transistors; a fifth transistor having a source and a drain coupled to the source and the drain, respectively, of the first transistor; and a sixth transistor having a source and a drain coupled to the source and the drain, respectively, of the third transistor.

19 Claims, 4 Drawing Sheets

(56) References Cited

U.S. PATENT DOCUMENTS

| | | |
|---|---|---|
| 7,224,760 B1 | 5/2007 | Rokhsaz et al. |
| 7,315,220 B1 | 1/2008 | Robinson et al. |
| 7,742,553 B1 | 6/2010 | Bataineh et al. |
| 7,764,129 B1 | 7/2010 | Wong et al. |
| 7,830,986 B1 | 11/2010 | Gaither |
| 8,120,430 B1 | 2/2012 | Vasudevan |
| 8,134,418 B2 | 3/2012 | Jiang |
| 8,666,010 B1 | 3/2014 | Novellini |
| 2005/0073371 A1* | 4/2005 | Brett ................. H03B 5/04 331/74 |

OTHER PUBLICATIONS

Fischette, Dennis Michael et al., "A 45nm SOI-CMOS Dual-PLL Processor Clock System for Multi-Protocol I/O," Proc. of the 2010 IEEE International Solid-State Circuits Conference, Feb. 7, 2010, pp. 246-248, EEE, Piscataway, New Jersey, USA.

\* cited by examiner

VOLTAGE-CONTROLLED OSCILLATOR WITH HIGH AND LOW GAIN OPTIONS

TECHNICAL FIELD

Examples of the present disclosure generally relate to electronic circuits and, in particular, to a voltage-controlled oscillator (VCO) with high and low gain options.

BACKGROUND

Voltage-controlled oscillators (VCOs) are used in phase-locked loops (PLLs) and like circuits to generate a clock signal. In order to achieve good rejection of supply noise, the VCOs are usually supply regulated. One technique for regulating the supply of a VCO is the use of a replica compensated linear regulator that provides both noise rejection and controls the frequency of oscillation.

One characteristic of a VCO is the gain (Kvco), which measures the sensitivity of the output frequency to input voltage, With newer fabrication technologies, the allowed supply voltage is decreasing while the VCO frequency requirement is increasing. This causes the gain of the VCO to increase with each new technology node. Higher VCO gain leads to higher deterministic jitter on the output of the application circuit, such as a PLL, due to noise on the VCO control voltage, Higher VCO gain also requires a larger filter capacitor in the loop filter depending on the PLL application, which requires more implementation area.

SUMMARY

Techniques for providing a voltage-controlled oscillator (VCO) with high and low gain options are described. In an example, a VCO includes: an oscillator having a supply input; and a voltage regulator, coupled to the supply input. The voltage regulator includes: a first transistor and a second transistor providing a first source-coupled transistor pair, and a third transistor and a fourth transistor providing a second source-coupled transistor pair; an active load coupled to drains of the first, second, third, and fourth transistors; a first current source coupled to sources of the first and second transistors, and a second current source coupled to sources of the third and fourth transistors; a fifth transistor having a source and a drain coupled to the source and the drain, respectively, of the first transistor; and a sixth transistor having a source and a drain coupled to the source and the drain, respectively, of the third transistor.

In another example, an integrated circuit includes: a first circuit having an input configured to receive a clock signal; a voltage-controlled oscillator (VCO) configured to generate the clock signal, the VCO having a low-gain control input and a high-gain control input; and a control circuit coupled to the low-gain control input and the high-gain control input. The VCO includes an oscillator, which includes a supply input, and a voltage regulator, coupled to the supply input. The voltage regulator includes: a first transistor and a second transistor providing a first source-coupled transistor pair, and a third transistor and a fourth transistor providing a second source-coupled transistor pair; an active load coupled to drains of the first, second, third, and fourth transistors; a first current source coupled to sources of the first and second transistors, and a second current source coupled to sources of the third and fourth transistors; a fifth transistor having a source and a drain coupled to the source and the drain, respectively, of the first transistor; and a sixth transistor having a source and a drain coupled to the source and the drain, respectively, of the third transistor.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
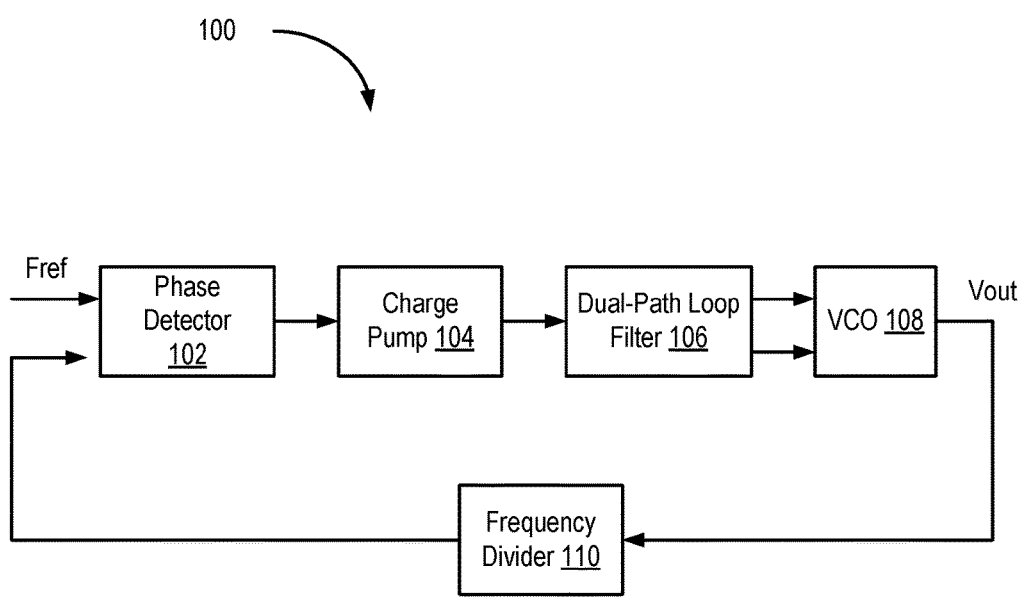
FIG. 1 is a block diagram depicting a phase-locked loop (PLL) that employs a voltage-controlled oscillator (VCO) according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Techniques for providing a voltage-controlled oscillator (VCO) with high and low gain options are described. By using the high and low gain options of the VCO in conjunction with the loop filter modifications known as dual-path loop filter, the effective gain (Kvco) of the VCO can be reduced.

In an example, a VCO includes an oscillator having a supply input, and a voltage regulator coupled to the supply input. The voltage regulator includes a first transistor and a second transistor providing a first source-coupled transistor pair, and a third transistor and a fourth transistor providing a second source-coupled transistor pair. The voltage regulator further includes an active load coupled to drains of the first, second, third, and fourth transistors. The voltage regulator further includes a first current source coupled to sources of the first and second transistors, and a second current source coupled to sources of the third and fourth transistors. The voltage regulator further includes a fifth transistor having a source and a drain coupled to the source and the drain, respectively, of the first transistor, and a sixth transistor having a source and a drain coupled to the source and the drain, respectively, of the third transistor. Assuming that the channel length of all the transistors are the same, by changing the ratio of width of fifth transistor to that of the first transistor (which is the same as the ratio of width of sixth transistor to that of the third transistor), the effective gain of the VCO can be changed. The fifth and sixth transistor connected to high-gain/low-bandwidth control is typically made larger than the first and third transistor which is connected to the low-gain/high-bandwidth path. By doing this most of the VCO gain is on the low-bandwidth control signal thereby reducing the effective gain of the VCO. These and further aspects are discussed below with respect to the drawings.

FIG. 1 is a block diagram depicting a phase-locked loop (PLL) 100 according to an example. The PLL 100 includes a phase detector 102, a charge pump 104, a dual-path loop filter 106, a voltage-controlled oscillator 108, and a frequency divider 110. A first input of the phase detector 102 receives a reference frequency. An output of the phase detector 102 is coupled to an input of the charge pump 104. An output of the charge pump 104 is coupled to an input of the dual-path loop filter 106. Outputs of the dual-path loop filter 106 are coupled to inputs of the VCO 108. An output of the VCO 108 is coupled to an input of the frequency divider 110. An output of the frequency divider 110 is coupled to a second input of the phase detector 102.

In operation, the phase detector 102 generates an error signal based on comparing a divided version of the VCO output (divided signal) with the reference frequency. The charge pump 104 outputs positive or negative current pulses in response to the error signal output by the phase detector 102. The dual-path loop filter 106 integrates the current pulses output by the charge pump 104 to generate both a low-gain/high-bandwidth voltage control signal and a high-gain/low-bandwidth voltage control signal. The VCO 108 generates an oscillating output voltage (Vout) in response to the voltage control signals from the dual-path loop filter 106. The frequency divider 110 outputs the divided signal by dividing the oscillating output of the VCO 108 by an integer or rational number. Operation of the VCO 108 is described further below.

In examples, the VCO 108 described herein can be used with a PLL, such as the PLL 100 shown in FIG. 1 or any other PLL, which may include a different architecture than that shown in FIG. 1. In general, the VCO 108 can be used to provide an oscillating voltage to any circuit that requires such an oscillating voltage (e.g., any circuit that requires a clock signal).

Figure 2:
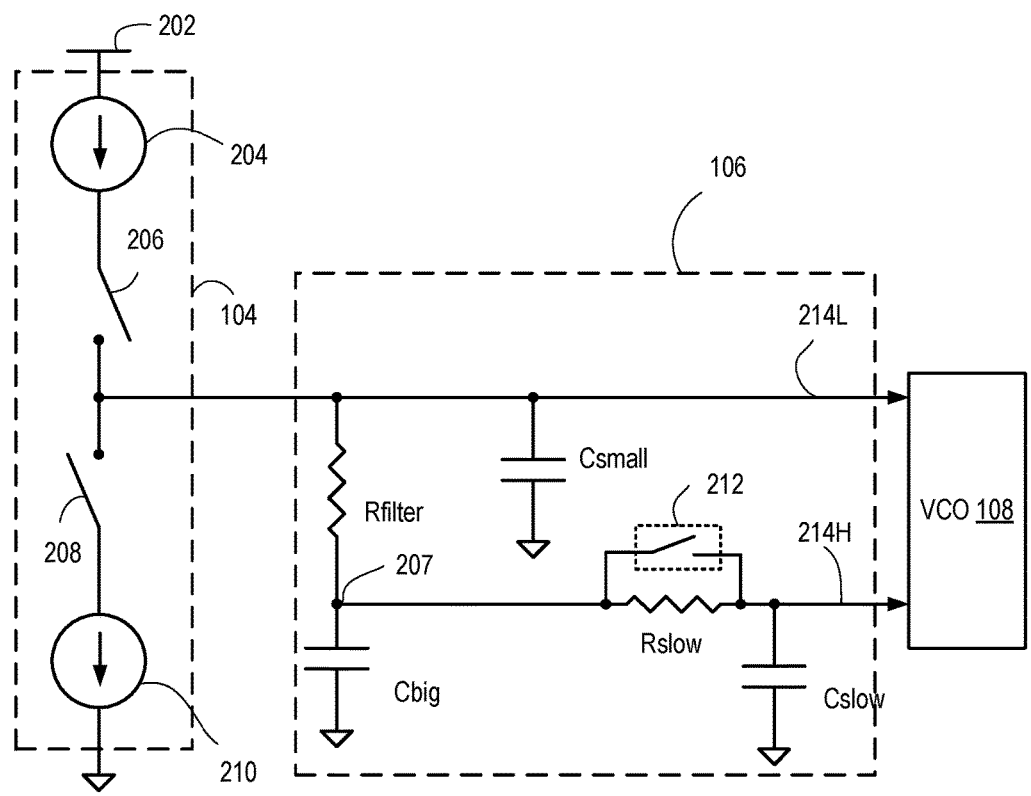
FIG. 2 is a block diagram depicting charge pump and dual-path loop filter circuitry according to an example.

FIG. 2 is a block diagram depicting the charge pump 104 and the dual-path loop filter 106 circuitry according to an example. The charge pump 104 and the dual-path loop filter 106 implement a control circuit for the VCO 108. The charge pump 104 includes a current source 204, a switch 206, a switch 208, and a current source 210. The current source 204 is coupled between a voltage source 202 and the switch 206. The switch 206 is coupled between the current source 204 and a node 214L, which provides a low-gain/high-bandwidth control voltage to the VCO. The current source 210 is coupled between the switch 208 and an electrical ground. The switch 208 is coupled between the current source and the node 214L. The switches 206 and 208 can be controlled by an external circuit, such as the phase detector 102. In operation, the current sources 204, 210 source a positive or negative current to the node 214L based on the state of the switches 206, 208.

The dual-path loop filter 106 includes a resistor Rfilter, a capacitor Cbig, a capacitor Csmall, a resistor Rslow, and a capacitor Cslow. The resistor Rfilter is coupled between the node 214L and a node 207. The capacitor Cbig is coupled between the node 207 and electrical ground. The capacitor Csmall is coupled between the node 214L and electrical ground. The resistor Rslow is coupled between the node 207 and a node 214H, which provides a high-gain/low-bandwidth control voltage. The capacitor Cslow is coupled between the node 214H and electrical ground.

In operation, the dual-path loop filter 106 provides both a low-gain control voltage and a high-gain control voltage for the VCO 108. The VCO 108 generates an oscillating output voltage in response to both the low-gain and high-gain control voltages. A typical single path loop filter only includes Rfilter and Cbig. The charge pulses from the charge pump 104 are accumulated by Cbig. Rfilter is present to provide stability (e.g., Rfilter adds a zero to the filter). The capacitor Csmall can be added to filter out ripples on the node 214L. Csmall is usually 5-10% the capacitance as Cbig. As discussed above, as VCO frequency range increases and as the control voltage range decreases, the VCO gain increases. Higher VCO gain leads to higher deterministic jitter on the output of the application circuit, such as a PLL, due to noise on the VCO control voltage, Higher VCO gain also requires a larger Cbig in the loop filter, which requires more implementation area.

Thus, dual-path loop filter 106 provides both low-gain/ high-bandwidth and high-gain/low-bandwidth control voltages to a two-input VCO 108 (described further below). The second path is provided using Rslow and Cslow. In general, the RC time constant of Rslow/Cslow is greater than the RC time constant of Rfilter/Cbig. In other words, the bandwidth of the high-gain path is very small compared to that of the low-gain path. For example, the bandwidth of the high-gain path can be less than 0.2% times the bandwidth of low-gain path. The low-gain path sets the overall PLL bandwidth while the high-gain path sets the VCO "center" frequency.

In an example, the dual-path loop filter 106 includes a switch 212 coupled between the node 207 and the node 214H (switch 212 is optional). The switch 212 can be closed to short the resistor Rslow, which effectively removes the high-gain control path from the dual-path loop filter 106. The switch 212 can be closed prior to achieve the lock state in the PLL 100 or when only single-path voltage control is desired. The dual-path loop filter 106 and charge pump 104 shown in FIG. 2 are merely exemplary and such circuitry can have other structures. In general, the dual-path loop filter 106 provides both low-gain and high-gain control voltages for use by VCO 108, as described further herein.

Figure 3:
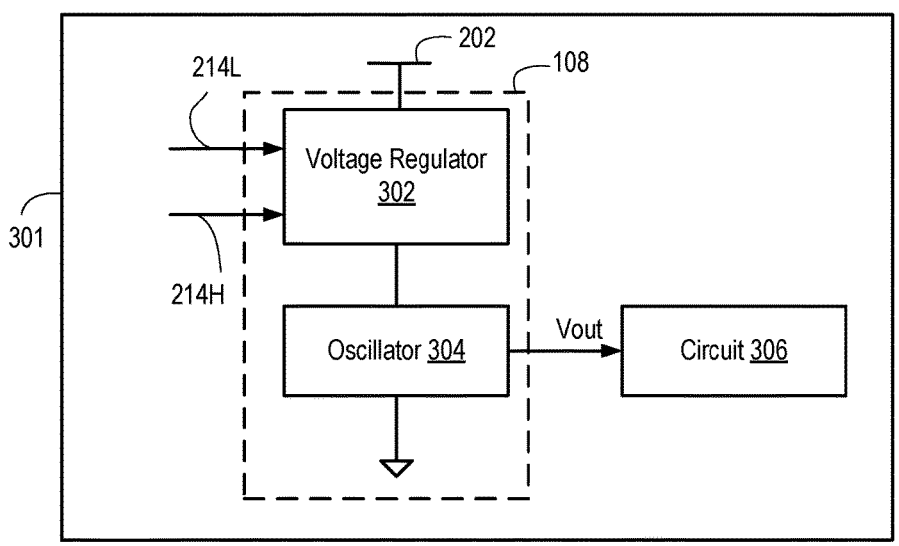
FIG. 3 is a block diagram depicting a VCO according to an example.

FIG. 3 is a block diagram depicting the VCO 108 according to an example. The VCO 108 includes a voltage regulator 302 and an oscillator 304. Inputs of the voltage regulator 302 receive the low-gain control voltage 214L and the high-gain control voltage 214H. An output of the voltage regulator 302 is coupled to a supply input of the oscillator 304. An output of the oscillator 304 provides the oscillating voltage (Vout). The frequency of Vout is controlled by the output of the voltage regulator 302, which in turn is controlled by the low-gain and high-gain control voltages 214L, 214H. In an example, the voltage regulator 302 comprises a replica-compensated linear regulator that can be used with a dual-path control scheme to reduce the effective gain of the VCO 108. Example details of the voltage regulator 302 are described below with respect to FIG. 4. The oscillator 304 can be a ring oscillator or the like. In general, the frequency of oscillation of the oscillator 304 is controlled by its supply voltage. The VCO 108 can be disposed in an integrated circuit (IC) 301. The VCO 108 can generate a clock signal for use by a circuit 306 that requires the clock signal (e.g., any type of logic having clocked circuit elements).

Figure 4:
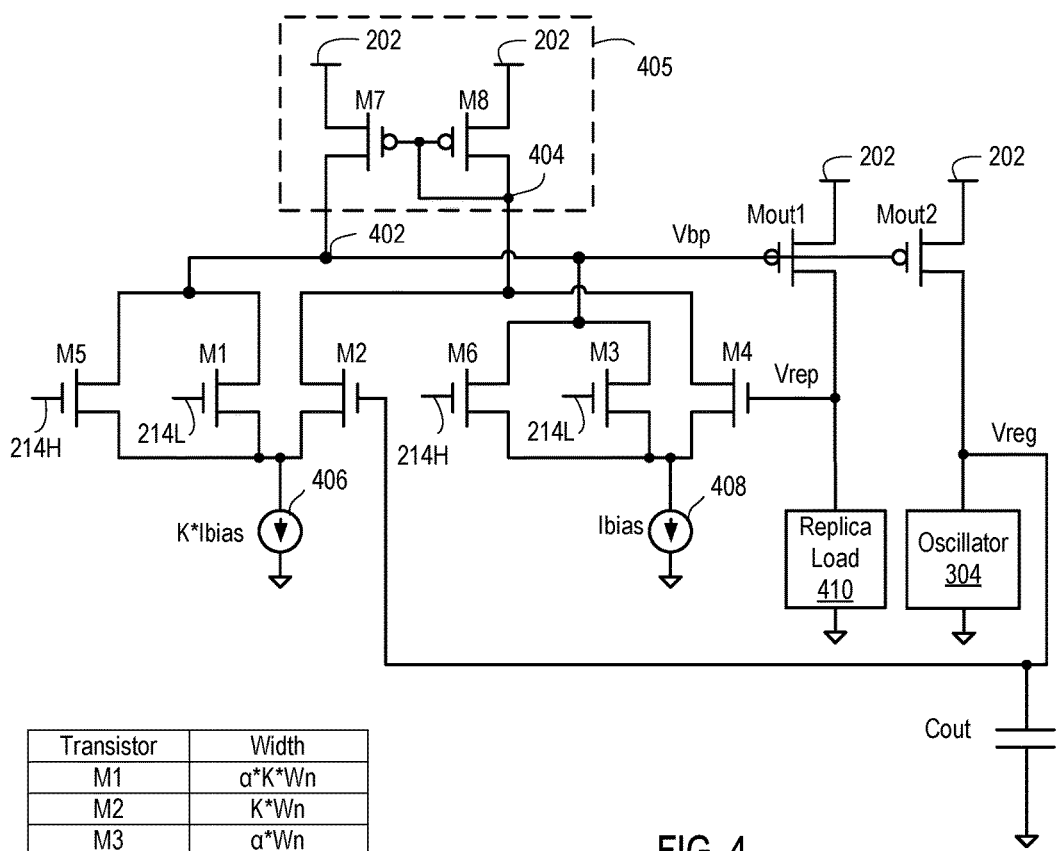
FIG. 4 is a schematic depicting a more detailed example of the VCO of FIG. 3.

FIG. 4 is a schematic diagram depicting the VCO 108 according to a more detailed example. The voltage regulator 302 includes transistors M1 through M8, transistors Mout1 and Mout2, replica load 410, and current sources 406, 408. The transistors M1 through M6 are n-channel field effect transistors (FETs), such as N-type metal oxide semiconductor FETs (N-type MOSFETs or NMOS). The transistors M7, M8, Mout1, and Mout2 are p-channel FETs, such as P-type MOSFETs (PMOS).

The transistors M1 and M2 provide a first source-coupled transistor pair (also referred to as a first differential transistor pair), and the transistors M3 and M4 provide a second source-coupled transistor pair (also referred to as a second differential transistor pair). In particular, the sources of the transistors M1 and M2 are coupled together. The current source 406 is coupled between the sources of the transistors M1, M2 and electrical ground. The sources of the transistors M3 and M4 are coupled together. The current source 408 is coupled between the sources of the transistors M3, M4 and electrical ground. The current sources 406, 408 are also referred to as tail current sources.

The transistors M7 and M8 provide an active load 405 for the source-coupled transistor pairs. In the example, the active load 405 comprises a gate-coupled transistor pair formed from M7 and M8. In particular, gates of the transistors M7 and M8 are coupled together. Sources of the transistors M7 and M8 are coupled to the voltage source 202. A drain of the transistor M7 is coupled to a node 402. A drain of the transistor M8 is coupled to a node 404. The gates of the transistors M7, M8 are coupled to the node 404. The drains of the transistors M1 and M3 are coupled to the node 402. The drains of the transistors M2 and M4 are coupled to the node 404. A gate of the transistor M1 is coupled to the node 214L to receive the low-gain control voltage. A gate of the transistor M3 is also coupled to the node 214L to receive the low-gain control voltage.

The transistor M5 includes a source coupled to the source of the transistor M1 and a drain coupled to the drain of the transistor M1. The transistor M6 includes a source coupled to the source of the transistor M3 and a drain coupled to the drain of the transistor M3. A gate of the transistor is coupled to the node 214H to receive the high-gain control voltage. A gate of the transistor M6 is also coupled to the node 214H to receive the high-gain control voltage.

Gates of the transistors Mout1 and Mout2 are coupled to the node 402, which provides a voltage Vbp. Sources of the transistors Mout1 and Mout2 are coupled to the voltage supply 202. A drain of the transistor Mout1 is coupled to a gate of the transistor M4 and provides a voltage Vrep. The replica load 410 is coupled between the gate of the transistor M4 and electrical ground. A drain of the transistor Mout2 is coupled to the supply input of the oscillator 304 (referred to as Vreg). The oscillator 304 is coupled between the drain of the transistor Mout2 and electrical ground. A gate of the transistor M2 is coupled to the drain of the transistor Mout2 to receive the voltage Vreg. A capacitor Cout can be coupled between the supply input of the oscillator 304 and electrical ground.

Assuming that the channel lengths of the transistors are the same, the ratio of gains of the high-gain path to the low-gain path in the VCO 108 is equal to that of the ratio of width of the transistor M5 to that of the transistor M1 (which is same as the ratio of width of the transistor M6 to that of the transistor) M3. The transistors M5 and M6 connected to high-gain/low-bandwidth control can be made larger than the transistors M1 and M3, which are connected to the low-gain/high-bandwidth path. In this manner, most of the VCO gain is on the low-bandwidth control signal thereby reducing the effective gain of the VCO. For example, the width of the transistors M5 and M6 could be made four times that of the transistors M1 and M3, respectively. In such a case, $4/5$ of the VCO gain is controlled by the high-gain control voltage and $1/5$ of the VCO gain is controlled by the low-gain control voltage. Providing both low-gain and high-gain control signals using the dual-path loop filter 106 lowers the overall gain of the VCO 108 without increasing the size of Cbig since the same Cbig could be redistributed to create the new Cbig and Cslow. Use of the low- and high-gain control voltages also provides an improvement in deterministic jitter by reducing the effective VCO gain.

In an example, assume that the channel length of all transistors is the same and that the transistor M4 includes a width designated Wn (e.g., width of an N-channel FET). In such case, the width of the transistor M3 is a*Wn, where a is a real number less than one and greater than zero. The width of the transistor M2 is K*Wn, where K is a real number greater than zero. For example, K can be 2-4 times the value of Ibias. The width of the transistor M1 is a*K*Wn. The width of the transistor M5 is $(1-\alpha)$*Wn. The width of the transistor M6 is $(1-\alpha)$*K*Wn. The width of the transistor Mout2 is Wp (e.g., width of a P-channel FET). In such case, the width of the transistor Mout1 is WP/M, where M is a real number greater than zero. The current source 406 sinks a current K*Ibias from the sources of the transistors M1, M2 (where Ibias is a given current set by design). The current source 408 sinks a current Ibias from the sources of the transistors M3, M4. The replica load 410 is designed to sink 1/Mth the average current of the oscillator 304.

In operation, the voltage regulator 302 provides a replica-compensated linear regulator. The value K is a design parameter that controls the replica branch size (the source-coupled pair M3, M4) in comparison to the regulator branch size (the source-coupled pair M1, M2). The value M is a design parameter that controls the replica driver size (the transistor Mout1) in comparison to the regulator driver size (the transistor Mout2). The value α is a design parameter that controls the VCO gain on the low-gain control voltage 214L and the high-gain control voltage 214H. Thus, the value of α controls how much the VCO 108 reacts to the low-gain control voltage, and the value $(1-\alpha)$ controls how much the VCO 108 reacts to the high-gain control voltage. For example, for a low-gain that is 20% of the original gain of the VCO 108, the value α can be set to 0.2. Of course, other values of α are possible for a given design.

In this manner, the voltage regulator 302 exhibits high supply noise rejection and high bandwidth along with low power consumption. By lowering the effective gain of the VCO 108 (Kvco), the bandwidth of the PLL 100 can be reduced, which in turn filters lower frequency noise on the reference clock. The lower bandwidth of the PLL 100 also helps reduce jitter due to quantization noise, such as when a sigma-delta modulator (SDM)-based fractional frequency divider is used as the frequency divider 110. Alternatively, the lower effective gain of the VCO 108 can be used to reduce the size of the dual-path loop filter 106 while retaining the original bandwidth of the PLL 100.

The VCO 108 described above can be implemented within an integrated circuit, such as a field programmable gate array (FPGA) or like type programmable circuit. The VCO 108 described above can be used to provide a clock signal to various circuits in the FPGA, such as a PLL circuit and the like.

Figure 5:
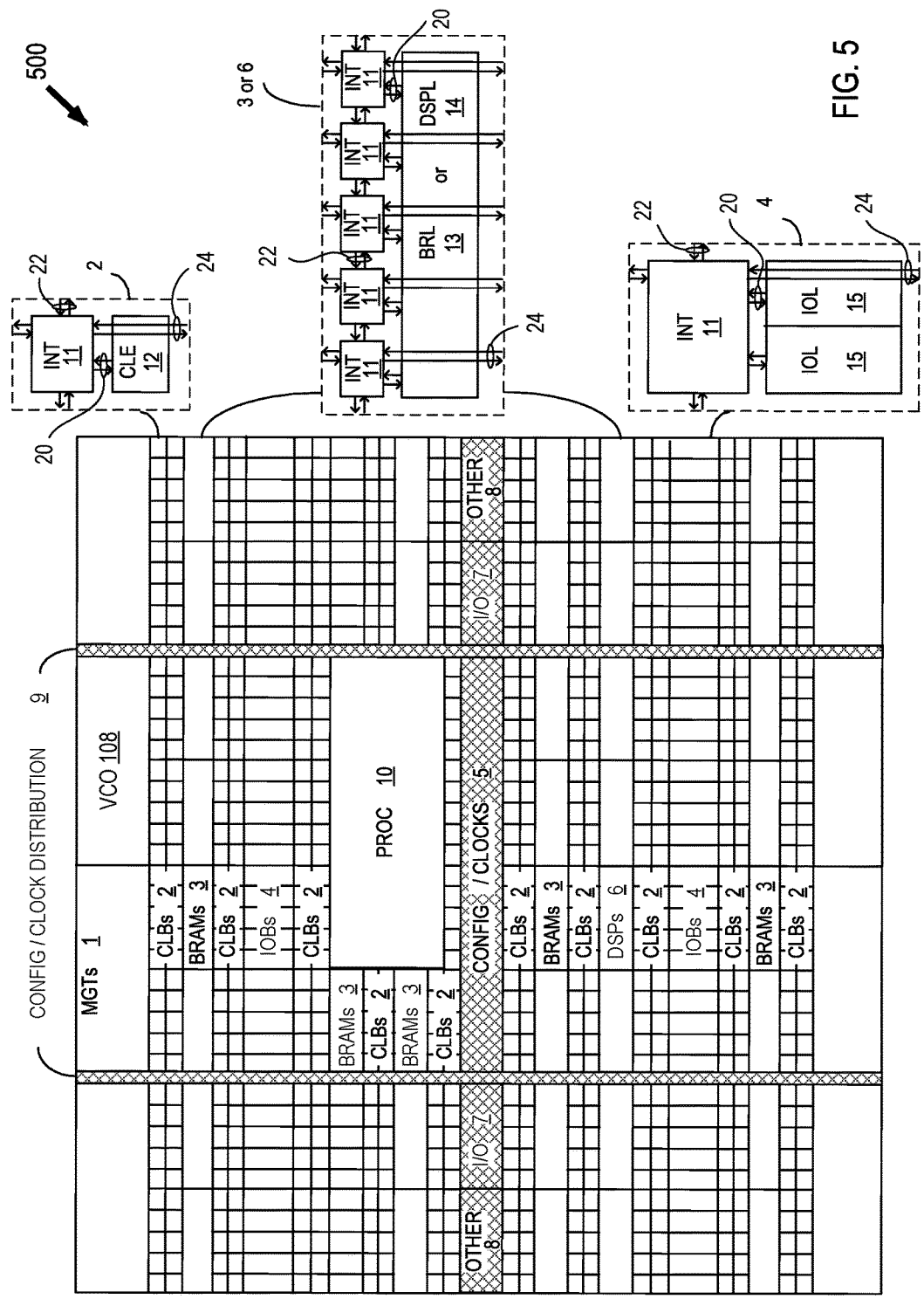
FIG. 5 illustrates a field programmable gate array (FPGA) that makes use of the VCO described herein.

FIG. 5 illustrates an architecture of FPGA 500 that includes a large number of different programmable tiles including multi-gigabit transceivers ("MGTs") 1, configurable logic blocks ("CLBs") 2, random access memory blocks ("BRAMs") 3, input/output blocks ("IOBs") 4, configuration and clocking logic ("CONFIG/CLOCKS") 5, digital signal processing blocks ("DSPs") 6, specialized input/output blocks ("I/O") 7 (e.g., configuration ports and clock ports), and other programmable logic 8 such as digital clock managers, analog-to-digital converters, system monitoring logic, and so forth. Some FPGAs also include dedicated processor blocks ("PROC") 10.

In some FPGAs, each programmable tile can include at least one programmable interconnect element ("INT") 11 having connections to input and output terminals 20 of a programmable logic element within the same tile, as shown by examples included at the top of FIG. 5. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element ("CLE") 12 that can be programmed to implement user logic plus a single programmable interconnect element ("INT") 11. A BRAM 3 can include a BRAM logic element ("BRL") 13 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 6 can include a DSP logic element ("DSPL") 14 in addition to an appropriate number of programmable interconnect elements. An IOB 4 can include, for example, two instances of an input/output logic element ("IOL") 15 in addition to one instance of the programmable interconnect element 11. As will be clear to those of skill in the art, the actual I/O pads connected, for example, to the I/O logic element 15 typically are not confined to the area of the input/output logic element 15.

In the pictured example, a horizontal area near the center of the die (shown in FIG. 5) is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, processor block 10 spans several columns of CLBs and BRAMs. The processor block 10 can include various components ranging from a single microprocessor to a complete programmable processing system of microprocessor(s), memory controllers, peripherals, and the like.

Note that FIG. 5 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 5 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A voltage-controlled oscillator (VCO), comprising:
an oscillator having a supply input; and
a voltage regulator, coupled to the supply input, the voltage regulator including:
   a first transistor and a second transistor providing a first source-coupled transistor pair, and a third transistor and a fourth transistor providing a second source-coupled transistor pair;
   an active load coupled to drains of the first, second, third, and fourth transistors;
   a first current source coupled to sources of the first and second transistors, and a second current source coupled to sources of the third and fourth transistors;
   a fifth transistor having a source and a drain coupled to the source and the drain, respectively, of the first transistor;
   a sixth transistor having a source and a drain coupled to the source and the drain, respectively, of the third transistor;
   a low-gain input coupled to a gate of each of the first and third transistors;
   a high-gain input coupled to a gate of each of the fifth and sixth transistors; and
   a replica load coupled to a gate of the fourth transistor;
   wherein a gate of the second transistor is coupled to the supply input of the oscillator.

2. The oscillator circuit of claim 1, wherein a width of the fourth transistor is W, a width of the third transistor is $\alpha*W$, a width of the second transistor is $K*W$, and a width of the first transistor is $\alpha*K*W$, where $\alpha$ and K are real numbers.

3. The oscillator circuit of claim 2, wherein a width of the fifth transistor is $(1-\alpha)*K*W$, and a width of the sixth transistor is $(1-\alpha)*W$.

4. The oscillator circuit of claim 1, wherein the active load comprises:
a seventh transistor and an eighth transistor providing a gate-coupled transistor pair, where sources of the seventh and eighth transistors are coupled to a supply voltage, drains of the seventh and eighth transistors are coupled to first and second nodes, respectively, and gates of the seventh and eighth transistors are coupled to the second node.

5. The oscillator circuit of claim 4, wherein the first node is coupled to the drains of the first transistor, the third transistor, the fifth transistor, and the sixth transistor, and wherein the second node is coupled to the drains of the second transistor and the fourth transistor.

6. The oscillator circuit of claim 5, wherein the voltage regulator further includes:
- a first output transistor having a source coupled to the supply voltage, a drain coupled to the gate of the fourth transistor, and a gate coupled to the first node; and
- a second output transistor having a source coupled to the supply voltage, a drain coupled to the supply input of the oscillator, and a gate coupled to the first node.

7. The oscillator circuit of claim 6, wherein a width of the second output transistor is W and a width of the first output transistor is W/M, where M is a real number.

8. The oscillator circuit of claim 1, further comprising:
- a capacitor coupled between the supply input of the oscillator and an electrical ground.

9. The oscillator circuit of claim 1, wherein the first, second, third, fourth, fifth, and sixth transistors are n-channel field effect transistors (FETs).

10. An integrated circuit, comprising:
- a first circuit having an input configured to receive a clock signal;
- a voltage-controlled oscillator (VCO) configured to generate the clock signal, the VCO having a low-gain control input and a high-gain control input; and
- a control circuit coupled to the low-gain control input and the high-gain control input;
- the VCO including an oscillator, which includes a supply input, and a voltage regulator, coupled to the supply input, the voltage regulator including:
  - a first transistor and a second transistor providing a first source-coupled transistor pair, and a third transistor and a fourth transistor providing a second source-coupled transistor pair;
  - an active load coupled to drains of the first, second, third, and fourth transistors;
  - a first current source coupled to sources of the first and second transistors, and a second current source coupled to sources of the third and fourth transistors;
  - a fifth transistor having a source and a drain coupled to the source and the drain, respectively, of the first transistor; and
  - a sixth transistor having a source and a drain coupled to the source and the drain, respectively, of the third transistor.

11. The IC of claim 10, wherein the voltage regulator further comprises:
- a low-gain input coupled to a gate of each of the first and third transistors;
- a high-gain input coupled to a gate of each of the fifth and sixth transistors; and
- a replica load coupled to a gate of the fourth transistor;
- wherein a gate of the second transistor is coupled to the supply input of the oscillator.

12. The IC of claim 11, wherein a width of the fourth transistor is W, a width of the third transistor is $\alpha*W$, a width of the second transistor is $K*W$, and a width of the first transistor is $\alpha*K*W$, where $\alpha$ and K are real numbers.

13. The IC of claim 12, wherein a width of the fifth transistor is $(1-\alpha)*K*W$, and a width of the sixth transistor is $(1-\alpha)*W$.

14. The IC of claim 10, wherein the active load comprises:
- a seventh transistor and an eighth transistor providing a gate-coupled transistor pair, where sources of the seventh and eighth transistors are coupled to a supply voltage, drains of the seventh and eighth transistors are coupled to first and second nodes, respectively, and gates of the seventh and eighth transistors are coupled to the second node.

15. The IC of claim 14, wherein the first node is coupled to the drains of the first transistor, the third transistor, the fifth transistor, and the sixth transistor, and wherein the second node is coupled to the drains of the second transistor and the fourth transistor.

16. The IC of claim 15, wherein the voltage regulator further includes:
- a first output transistor having a source coupled to the supply voltage, a drain coupled to the gate of the fourth transistor, and a gate coupled to the first node; and
- a second output transistor having a source coupled to the supply voltage, a drain coupled to the supply input of the oscillator, and a gate coupled to the first node.

17. The IC of claim 16, wherein a width of the second output transistor is W and a width of the first output transistor is W/M, where M is a real number.

18. The IC of claim 10, further comprising:
- a capacitor coupled between the supply input of the oscillator and an electrical ground.

19. The IC of claim 10, wherein the first, second, third, fourth, fifth, and sixth transistors are n-channel field effect transistors (FETs).

* * * * *